United States Patent [19] [11] Patent Number: 6,146,910
Cresswell et al. [45] Date of Patent: Nov. 14, 2000

[54] TARGET CONFIGURATION AND METHOD FOR EXTRACTION OF OVERLAY VECTORS FROM TARGETS HAVING CONCEALED FEATURES

[75] Inventors: Michael W. Cresswell, Frederick; Santos Mayo, Rockville; Jeremiah R. Lowney, Leonardtown, all of Md.

[73] Assignee: The United States of America, as represented by the Secretary of Commerce, Washington, D.C.

[21] Appl. No.: 09/241,436

[22] Filed: Feb. 2, 1999

[51] Int. Cl.⁷ .............................. G01R 31/26; H01L 21/66
[52] U.S. Cl. ................................. 438/14; 438/401
[58] Field of Search .............................. 438/7, 10, 5, 11, 438/14, 800, 401

[56] References Cited

U.S. PATENT DOCUMENTS

| 3,762,038 | 10/1973 | Ruggiero . |
| 3,849,659 | 11/1974 | O'Keeffe . |
| 3,874,916 | 4/1975 | Livesay et al. . |
| 3,876,883 | 4/1975 | Broers et al. . |
| 4,123,661 | 10/1978 | Wolf et al. . |
| 4,546,260 | 10/1985 | Simpson et al. . |
| 4,610,948 | 9/1986 | Glendinning . |
| 4,992,394 | 2/1991 | Kostelak, Jr. et al. . |
| 5,332,470 | 7/1994 | Crotti . |
| 5,369,050 | 11/1994 | Kawai . |
| 5,552,611 | 9/1996 | Enichen . |
| 5,665,968 | 9/1997 | Meisburger et al. . |
| 5,892,230 | 4/1999 | Goodberlet et al. . |
| 6,023,338 | 2/2000 | Bareket . |

Primary Examiner—Charles Bowers
Assistant Examiner—Evan Pert
Attorney, Agent, or Firm—Larson & Taylor

[57] ABSTRACT

A method is provided for extracting overlay information from a target of an integrated circuit wafer wherein the first-level target has features which are optically concealed by an overlying opaque planarized film. The target employed has an architecture including a resist feature on the planarized film and an embedded electron backscattering target feature disposed beneath the planarized film. This target is scanned with an electron bean of an energy sufficiently high (e.g., at least 11 keV) to penetrate the planarized film, be backscattered by the backscattered feature and return through the planarized film or through the planarized film and the resist feature. Electrons backscattered from the conductive first-level target feature through the resist feature are detected and a signal profile is generated based thereon. This signal profile is analyzed to extract overlay information.

10 Claims, 2 Drawing Sheets

TARGET CONFIGURATION AND METHOD FOR EXTRACTION OF OVERLAY VECTORS FROM TARGETS HAVING CONCEALED FEATURES

FIELD OF INVENTION

The present invention relates to methods and devices for measuring the overlay between patterns at different levels in semiconductor wafers.

BACKGROUND OF THE INVENTION

In the manufacturing of integrated circuits (ICs), measuring the overlay of the patterning of a second level on a semiconductor wafer relative to the patterning of a first level is achieved by analysis of the optical image of an assembly or arrangement of features referred to as a "target." Such feature assemblies are fabricated on the wafer surface at the same die site using the same processes and tools used to form the working features of the integrated circuit itself. The purpose of this approach is to provide an overlay metrology as a means for monitoring the quality of the fabrication process. As discussed below, problems are created when the optical image of the target is severely obstructed by new fabrication techniques now being introduced by IC manufacturers.

Referring to FIG. 1, one of several standard target architectures is shown. The illustrated target architecture is the conventional "bars-in-bars" configuration and comprises two orthogonal sets of spaced, parallel inner bars 10 patterned in the same conductor material of the first level and two further sets orthogonal of spaced, parallel outer bars 12 patterned in the material of the second level. One of the sets of the bars 10 and 12 usually comprises photoresist material. Optical instruments (not shown) are used to provide on-wafer overlay metrology whereby to extract the overlay vector. This is represented schematically in FIG. 2 wherein the bars 10' and 12' of the bars-in-bars pattern are out of registration and the corresponding overlay vector is indicated at 14.

In interconnect fabrication, i.e., wafer fabrication wherein there is an interconnection between levels, there are two key and distinct metrology-overlay applications in which the second level is patterned in resist, i.e., using a photoresist material. In "Type A" applications illustrated in FIG. 3, the overlay of patterned resist 12 (the second level), which is deposited over or on a dielectric film 14, is measured relative to conducting elements or features 10 buried by, i.e., disposed within, the dielectric film 14, as illustrated. Typically, the resist patterning at a die site determines where "vias," i.e., transverse (vertical) connection passages between levels, are etched through the dielectric film 14 to facilitate the formation of electrical interconnections referred as "plugs" (not shown). These plugs usually are made of the refractory metal tungsten. Because the dielectric film is usually optically transparent, light scattered from the buried elements or features 10 effectively contributes to the referenced optical image from which the overlay vector described above can be extracted by pattern recognition-analysis techniques.

In "Type B" applications, illustrated in FIG. 4, the patterned resist 12 is deposited over an optically opaque film 16 made of conducting material, usually aluminum. This resist patterning determines the overlay of subsequent patterning of the overlying film 16 of conducting material relative to previously formed tungsten interconnection plugs 18 providing electrical connection to the lower surface of film 16.

The value of the overlay vector between the interconnection plugs 18 and the resist patterning 12 is a critical manufacturing specification and is the subject of the metrology. However, because the tungsten interconnection plugs 18 are optically concealed, the plugs 18 cannot contribute directly to build the optical image of the target without additional processing aimed at revealing the buried plug location. Recent practice has been to extract the overlay vector from an image contribution rendered by residual topographical features, indicated at 19 in FIG. 4, that are propagated to the upper surface of the opaque film 16 by the wafer-processing dynamics.

In modern IC fabrication, the preferred technology for synthesizing multi-level interconnect systems uses CMP (Chemical-Mechanical Polishing) planarization to facilitate high resolution lithography through the minimization of adverse depth-of-focus limitations or effects. In principle, overlay metrology in Type A applications (wherein, as shown in FIG. 3, a transparent layer 14 separates the patterned levels 10 and 12 the overlapping of which is being examined) is not adversely affected by the use of CMP planarization processes. However, in type B applications, optical metrology is ineffective when, referring to FIG. 4, the upper surface of the opaque film 16 is rendered topographically featureless by the practice of CMP. In other words, the shallow residual topographical features 19 are essentially erased or smoothed out when CMP is used, and thus no residual features are left to be employed to extract the overlay vector. The prior art does not provide a method or means for locating the concealed tungsten features 18 so as to enable overlay metrology in Type B applications wherein CMP is employed.

SUMMARY OF THE INVENTION

In accordance with the invention, a method is provided for locating features which are optically concealed in Type B applications wherein CMP is used so as to facilitate planarization. In general, the method of the invention involves imaging of backscattered electrons from a high energy scanning beam, and advantageously uses a collector-plate geometry which matches a novel target architecture replicated on the substrate or wafer.

In accordance with a preferred embodiment of the invention, a method for extracting overlay information from a target on an integrated circuit wafer wherein the target includes embedded features on a first level which are optically concealed by an overlying planarized opaque film, the method comprising: providing resist features deposited on the opaque planarized film and an embedded electron backscattering target feature deposited beneath said film under the resist features; scanning the target feature with an electron beam of an energy sufficiently high (preferably, at least 11 keV and, advantageously about 20 keV) to penetrate the opaque planarized film, be backscattered by the embedded features on said first level and return through the opaque planarized film (not traversing the resist features); detecting electrons backscattered from the embedded electron backscattering target feature (traversing or not through the resist features), and generating a signal profile based thereon; and analyzing the signal profile to extract overlay information.

Preferably, the detecting of backscattered electrons comprises collecting the electrons on a collector plate of a predetermined geometry matching the resist-feature geometry. Advantageously, the collector plate comprises first and second collector plate members, each of the plate members having shape, in plan, of a sector of an annulus and the plate members being disposed in end to end relation in a common plane.

The resist feature preferably comprises at least one resist line and the first-level target architecture further comprises at least one embedded electron backscattering line which serves as a reference for overlay measurements made relative to the resist line. Advantageously, the resist feature comprises parallel resist lines and the reference target first-level architecture comprises first and second parallel embedded electron backscattering lines extending parallel to, and disposed on opposite sides of, the parallel resist lines. The parallel resist lines preferably each have a gap therein which reduces the risk of ablation of the resist material by the primary beam electrons, and the first-level target feature preferably comprises at least one embedded electron backscattering element disposed beneath the resist lines at least partially under the gaps in the resist lines. The at least one embedded electron backscattering element advantageously comprises a plurality of electron backscattering pads. The parallel conductive lines and resist lines are advantageously part of a bars-in-bars target configuration.

Other features and advantages of the invention will be set forth in, or apparent from, the following detailed description of preferred embodiments of the invention.

DESCRIPTION OF THE PREFERRED EMBODIMENTS

Figure 1:
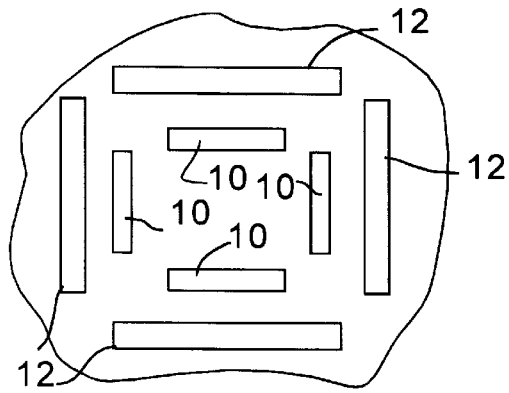
FIGS. 1 and 2, which were described above, are plan views of prior art target configurations.
Figure 2:
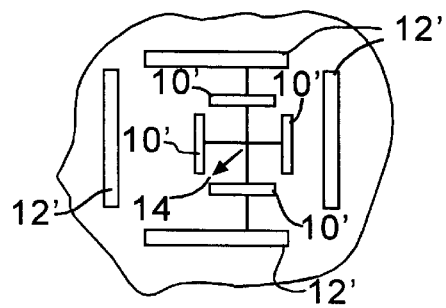
Figure 3:
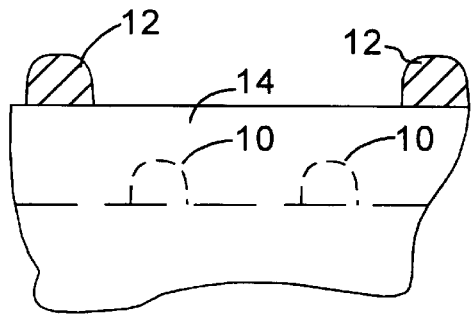
FIGS. 3 and 4, which were also discussed above, are traverse cross-sectional views of prior art target configurations corresponding to those shown in FIGS. 1 and 2, for Type A and Type B target architectures, respectively.
Figure 4:
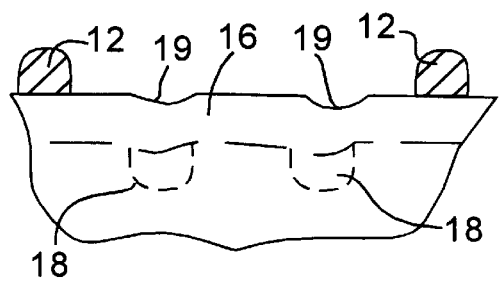
Figure 5:
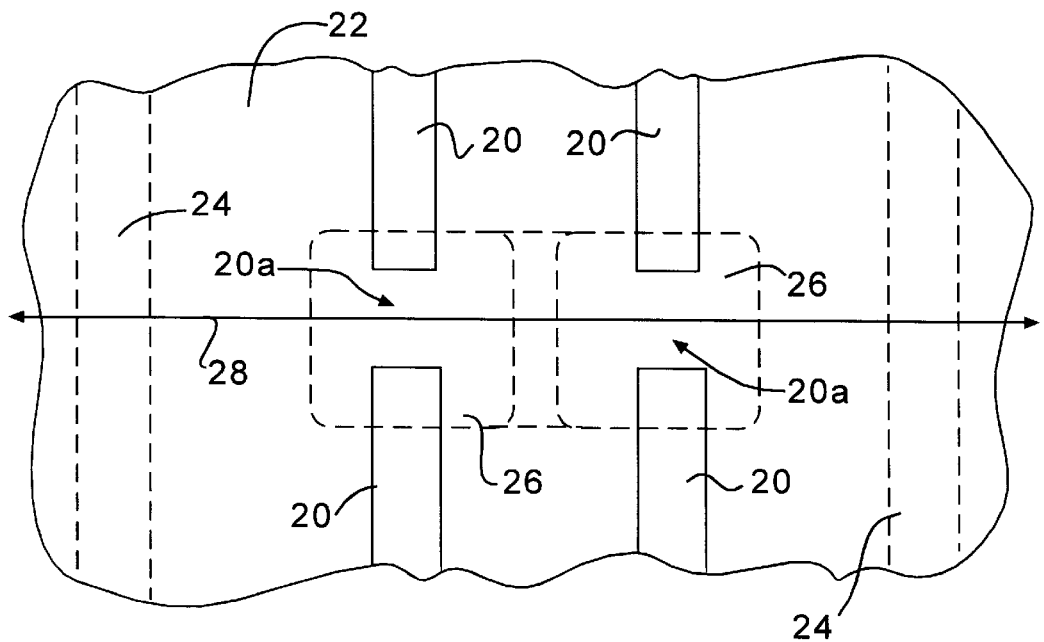
FIGS. 5 and 6 are a top plan view and a transverse cross-sectional view, respectively, of a target architecture in accordance with a preferred embodiment of the invention.
Figure 6:
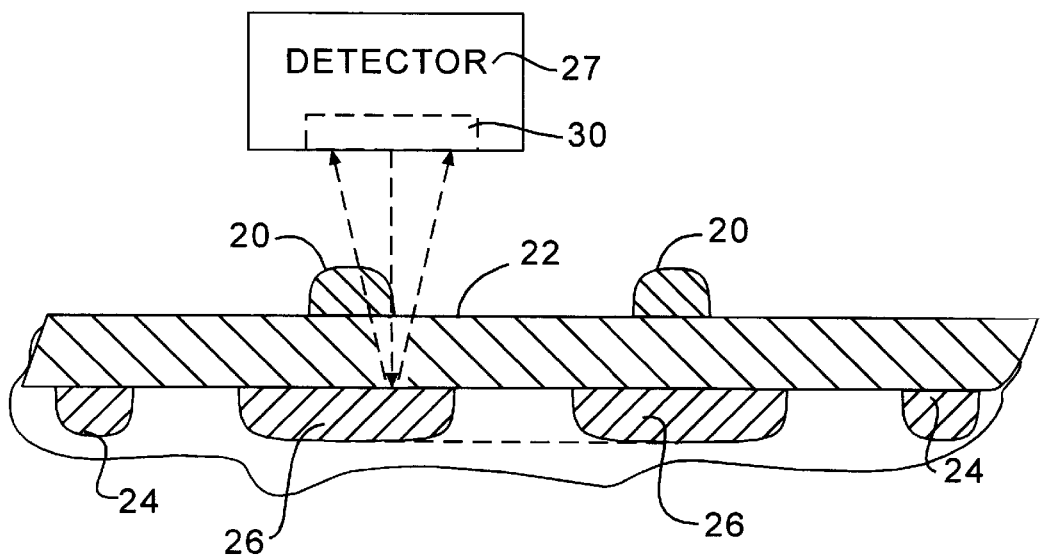

Referring to FIGS. 5 and 6, there is shown a target constructed in accordance with a preferred embodiment of the invention. The target shown in FIGS. 5 and 6 is fabricated by wafer-processing typically preceding Type B metrology applications and it is to be understood that an only one-dimensional version or embodiment of the invention is shown for simplicity of description. However, generalization to a two-dimensional version or embodiment is well within the skill of those skilled in the art. It is also to be understood that the target shown is preferably part of a bars-in-bars configuration such as described above in connection with FIGS. 1 and 2 and would also include orthogonal, elements, i.e., horizontal components elements as viewed in FIGS. 5 and 6.

In FIGS. 5 and 6, second-level resist lines or bars are denoted 20 while an opaque conductive film to be patterned (typically aluminum) is generally denoted 22. Lateral bars 24, located beneath film layer 22 and typically made of tungsten, serve as a reference for overlay measurements relative to resist lines and constitute embedded features on the first level 20. A pair of conductive pads 26, also preferably of tungsten, are located beneath the aluminum film 22 in the area of respective gaps 20a between resist lines 20 and constitute embedded back scattering target features. More particularly, the inner tungsten pads 26 serve to create backscattered electrons which penetrate the aluminum film 22 in the vicinity of the resist lines 20. Although two pads 26 are shown, a single overall pad could also be used as indicated by dashed lines in FIGS. 5 and 6. The gaps 20a in the resist lines 20 are important because these gaps help prevent possible ablation of the resist material by the primary electron beam irradiation when it is scanned along 28.

The interaction of the primary electron beam with the first-level tungsten target 24 and the tungsten pad 26 creates, via backscattering, a virtual internal source of electrons that serve to image the target 24 plus the resist lines 20 lying over the opaque planarized film 22.

The extraction of overlay proceeds by scanning along the inspection path with the primary electron beam at high energy (typically 20 keV), this beam path being indicated by the double ended arrow 28 in FIG. 5 and a conventional detector device which produces the primary beam being indicated schematically at 27 in FIG. 6. The beam energy must be sufficiently high, i.e., above about 11 keV, to penetrate the overlaying aluminum film 22, and to enable the energy to be selectively backscattered by the concealed tungsten pads 26 and to thence emerge from the aluminum film 22 for collection. Below approximately 11 keV, penetration by incident and backscattered electrons is substantially reduced. It is important to note that, at all energies, the substantially higher atomic weight, and thus higher backscattering coefficient, of tungsten relative to aluminum, results in a commensurately higher backscattering contrast, thereby favoring detection of the optically concealed reference tungsten pads 24. At each location along path 28, the SEM signal detected is directly proportional to the rate of collection of backscattered electrons. Whereas the electrons backscattered from the aluminum film 22 provide a constant contribution to the collected signal, the contribution to the signal resulting from electrons backscattered by buried tungsten features such as features 24 and 26 depend on the proximity of the incident beam to those features.

Whatever the physical source of the backscattering, the signal which is registered by the detector 27 is based on collecting electrons emerging within a solid cone having a vertical axis coincident with the incident beam. As a consequence, some returning electrons, predominately those backscattered by one or more of the tungsten features 26, travel through, or become absorbed by, the resist lines 20 to an extent which is highly dependent on the position of the beam along the inspection path. It has been found that electrons backscattered from target points have their trajectories to the collector plate (indicated at 30 in FIG. 6) intersected by resist lines 20 and, due to their low energy, absorbed. The resultant locally lower current, which converts directly to a lower SEM detection signal, enables registering the location of the resist features (e.g., lines 20) with the same high-energy primary beam necessary for registering the location of the concealed tungsten plugs. This is a key condition for avoiding possible errors which might be referred as to "voltage shifts," i.e., the apparent mislocation of an object resulting from variations in the electron optics response of the system due to variations in electron energy. In this regard, one problem to be solved is to image both the resist and buried tungsten features with the same beam while avoiding direct exposure of the resist with the high-energy beam.

Figure 7:
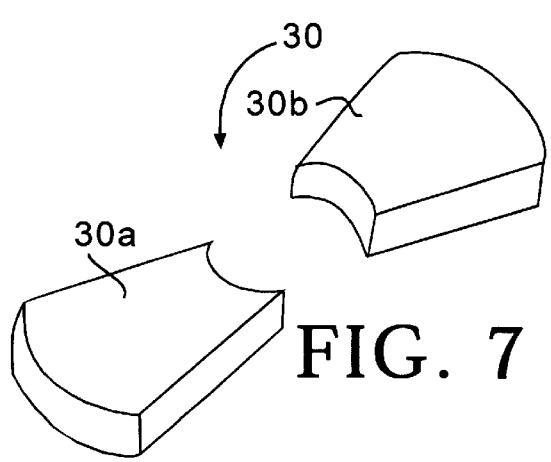
FIGS. 7 and 8 are a perspective view and a top plan view, respectively, of a collector plate configuration in accordance with a further aspect of the invention.
Figure 8:
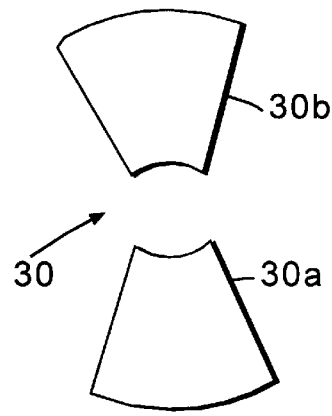

It is also noted that as the primary electron beam is scanned along the inspection path 28, the collector plate current signal fluctuates according to the beam position, the backscattered electron yield from 26, and the electron absorption by line 20. In accordance with a further aspect of the invention, the detection of the locally lower point of collector plate current produced when the primary electron beam is scanned along line 28, allows registering the locations of resist lines 20. This location is more precisely determined when the detector geometry is as shown in FIGS. 7 and 8. In a conventional detector this component normally has the form of a split donut with internal and external diameters of 2.5 and 12.5 mm, respectively. As shown in FIG. 8, the detector plate 30 has the form, in plan, of two sectors 30a and 30b of such a donut, with the inner and outer arcuate edges being defined by arcs of circles of the same diameters. It has been found that a collector plate of this geometry enhances the contrast with which the resist lines (e.g., lines 20) are imaged by electrons backscattered from the buried tungsten features (e.g., pads 26).

In general, the approach or method described above, i.e., one employing an electron beam of an energy sufficiently high to enable penetration through the aluminum film 22, in conjunction with the second-level target architecture of FIGS. 5 and 6, which is matched to the collector plate geometry of FIGS. 7 and 8, enables generation of a signal profile from which an overlay may be extracted regardless of the topographical or optical visibility of the buried tungsten features. This signal profile can then be compared with the baseline signal profile associated with the resist lines, i.e., without backscattering. In general, the embedded overlay is extracted by using a statistical approach similar to that used in conventional optical overlay metrology.

It is noted that an important feature of the invention, from an applications standpoint, is that the high energy beam is not required to directly impinge on the patterned resist of a Type B target. Although, the degree of necessity of this requirement is not generally agreed upon in the metrology community, it is widely believed that high energy beams may sputter hydrocarbon components of the resist and accumulatively contaminate the column of the electron-beam system, thereby compromising the electron optics thereof. In the present invention, the essential spatial reference defined by the resist patterning is provided by backscattered electrons originating in the tungsten plugs and emerging from the upper surface of the planarized aluminum (film 22) where the electrons are selectively absorbed by the patterned resist (resist 20).

It will be appreciated that while the description above has focused on locating resist lines 20, these lines must be referenced to tungsten lines 24. It is anticipated that the resultant special signal will include separate end peaks, due to lines 24, flanking a central signal portion having dips therein due to absorption by resist lines 20.

Although the present invention has been described relative to specific exemplary embodiments thereof, it will be understood by those skilled in the art that variations and modifications can be effected in these exemplary embodiments without departing from the scope and spirit of the invention.

What is claimed:

1. A method for extracting overlay information from a first-level target of an integrated circuit wafer wherein the target includes embedded features at a first level which are optically concealed by an opaque overlying planarized film, said method comprising:

providing at least one resist feature on an opaque planarized film and an embedded electron backscattering target feature disposed beneath the film at least partially under the resist feature;

scanning the target with a primary electron beam of an energy sufficiently high to penetrate the planarized film, to be backscattered by the backscattering feature and to traverse back through the planarized film;

detecting a first signal due to backscattered electrons from said first-level target together with a further signal due to backscattered electrons traversing through the resist feature, and generating a signal profile based on said signals; and analyzing said signal profile to extract overlay information.

2. A method as claimed in claim 1 wherein said detecting of said backscattered electron signal comprises collecting said electrons on a collector plate comprising first and second collector plate members, each of said plate members having shape, in plan, of a sector of an annulus and said plate members being disposed in end to end relation in a common plane.

3. A method as claimed in claim 1 wherein said at least one resist feature comprises at least one resist line and the embedded features at the first level comprise at least one embedded conductive line which serves as a reference for overlay measurements made relative to said resist line.

4. A method as claimed in claim 1 wherein said resist feature comprises parallel resist lines and the embedded features at the first level comprise first and second parallel embedded conductive lines extending parallel to, and disposed on opposite sides of, said parallel resist lines.

5. A method as claimed in claim 1 wherein said resist feature comprises parallel resist lines each having a gap therein and said embedded backscattering target feature comprises at least one embedded backscattering element disposed beneath said resist lines at least partially in the gap in the resist lines.

6. A method as claimed in claim 5 wherein said at least one embedded backscattering element comprises a pair of backscattering pads.

7. A method as claimed in claim 5 wherein said embedded features at the first-level comprise first and second embedded conductive lines disposed on opposite side 6 of, and extending parallel to, said parallel resist lines.

8. A method as claimed in claim 7 wherein said parallel first-level conductive lines and resist lines are part of a bars-in-bars target configuration.

9. A method as claimed in claim 1 wherein said electron beam has an energy of at least 11 keV.

10. A method as claimed in claim 9 wherein said electron beam has an energy of approximately 20 keV.

* * * * *